United States Patent
Haga

(10) Patent No.: US 6,838,308 B2
(45) Date of Patent: Jan. 4, 2005

(54) SEMICONDUCTOR POLYSILICON COMPONENT AND METHOD OF MANUFACTURE THEREOF

(75) Inventor: Koichi Haga, Miyagi (JP)

(73) Assignees: Tohoku Techno Arch Co., Ltd. (JP); Sharp Corporation (JP)

( * ) Notice: Subject to any disclaimer, the term of this patent is extended or adjusted under 35 U.S.C. 154(b) by 70 days.

(21) Appl. No.: 10/344,840

(22) PCT Filed: May 14, 2001

(86) PCT No.: PCT/JP01/03998
§ 371 (c)(1),
(2), (4) Date: Feb. 13, 2003

(87) PCT Pub. No.: WO02/17368
PCT Pub. Date: Feb. 28, 2002

(65) Prior Publication Data
US 2004/0023432 A1 Feb. 5, 2004

(30) Foreign Application Priority Data
Aug. 18, 2000 (WO) .............................. PCT/JP00/05575

(51) Int. Cl.[7] ................................................ H01L 21/16
(52) U.S. Cl. ........................ 438/104; 438/30; 438/149; 438/785; 257/103; 257/410
(58) Field of Search ........................... 438/104, 30, 149, 438/150, 785; 257/103, 410, 613

(56) References Cited

U.S. PATENT DOCUMENTS 6,727,522 B1 * 4/2004 Kawasaki et al. .......... 257/103

FOREIGN PATENT DOCUMENTS

JP 2000-137342 5/2000 ............ G03G/5/08

\* cited by examiner

*Primary Examiner*—Caridad Everhart
(74) *Attorney, Agent, or Firm*—Hayes Soloway P.C.

(57) ABSTRACT

On a transparent substrate, by use of, for instance, vapor deposition, an Al film is formed. Subsequently, with a DC-bias applied on a surface of the Al film, a first zinc oxide thin film is formed by use of a sputtering method. On a surface of the first zinc oxide thin film, according to an atmospheric MO-CVD method, a second zinc oxide thin film is formed. When the second zinc oxide thin film deposited by use of an MO-CVD method is formed on the first zinc oxide thin film having a-axis orientation, the second zinc oxide thin film becomes to have the a-axis orientation. Since the Al thin film, owing to heat during the deposition by use of the MO-CVD method, is absorbed in the first zinc oxide thin film, the transparency is improved. As a result, a sample having a ZnO/ZnO/Al/glass structure becomes high in the transparency as a whole.

10 Claims, 14 Drawing Sheets

---▶ FLOW OF ELECTRIC CURRENT

Fig 3 (a)
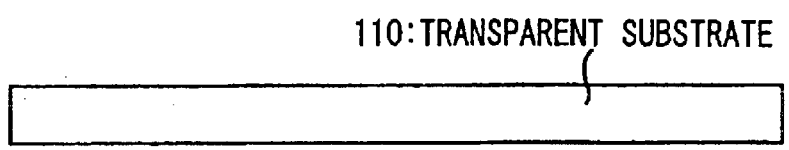
Fig 3 (b) VAPOR DEPOSITION
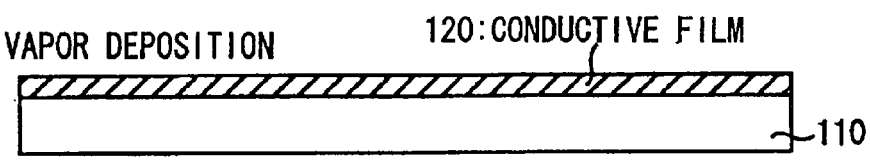
Fig 3 (c) SPUTTER
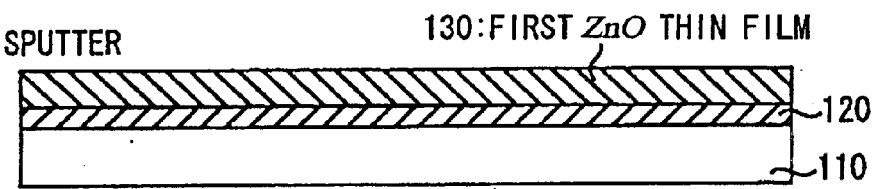
Fig 3 (d) MO-CVD
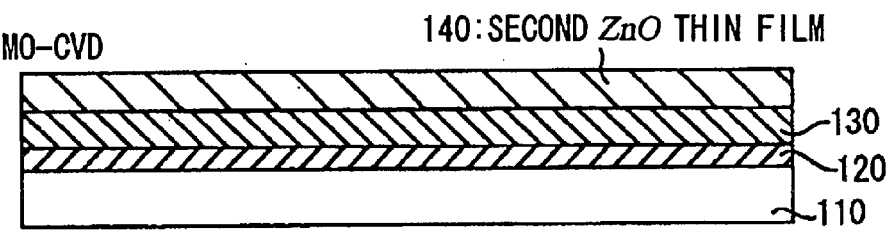

M: METAL CHEMICAL ELEMENT

Fig 13 (a) AFTER THE FORMATION OF SECOND ZINC OXIDE THIN FILM
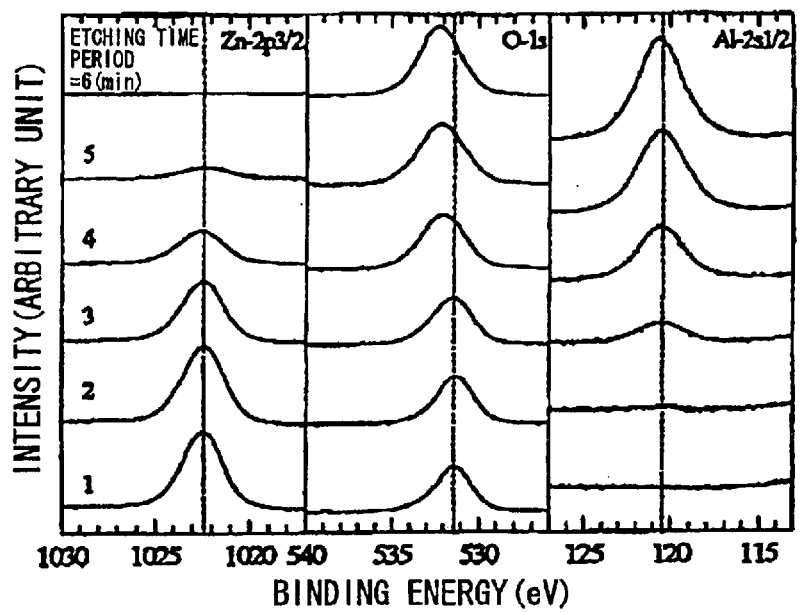
Fig 13 (b) IMMEDIATELY AFTER THE FORMATION OF FIRST ZINC OXIDE THIN FILM
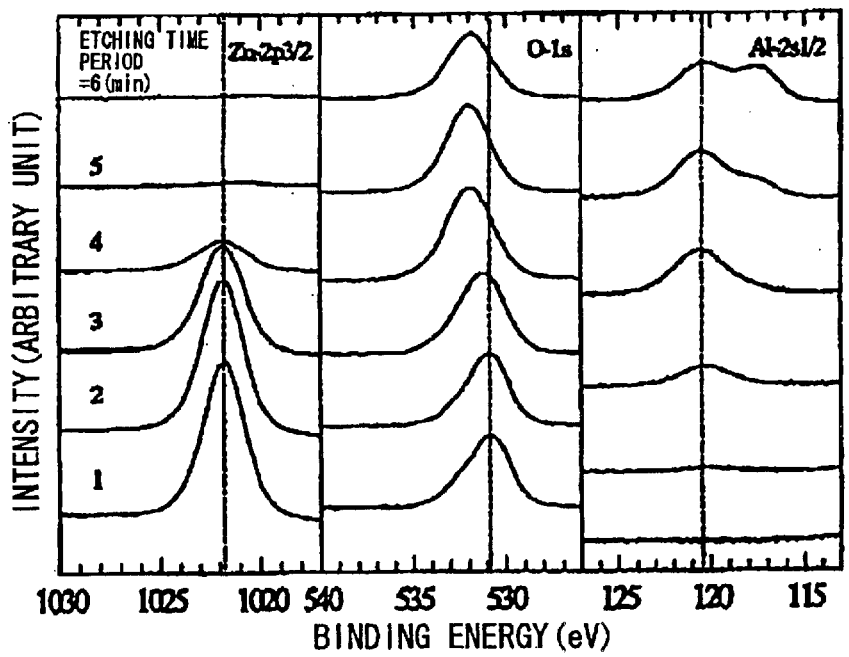

SEMICONDUCTOR POLYSILICON COMPONENT AND METHOD OF MANUFACTURE THEREOF

TECHNICAL FIELD

The present invention relates to a semiconductor member suitable for constituting a transparent semiconductor element, in particular, to zinc oxide that is high in the transparency and low in the resistivity.

BACKGROUND ART

A polycrystalline zinc oxide member whose constituent elements are zinc and oxygen is expected to apply in a photo-detector, a surface acoustic wave element, a piezo-electric element, a transparent conductive electrode and an active element. As a method of fabricating the same, many methods such as an MBE method in an ultra-high vacuum, a laser aberration method, a sputtering method, a vacuum deposition method, a sol-gel method, and an MO-CVD method are under study.

As to an active element such as a transparent transistor and so on, from a point of view of the crystallinity, a method in which the MBE method in an ultra-high vacuum and the laser aberration method are combined is a present main stream. However, the method is not a preferable method in realizing a low cost and large area active element. In contrast, in the fabrication of a transparent conductive electrode, the method is usually used and top data are obtained therewith. Furthermore, in large area deposition, the sputtering method is tried. However, low resistivity comparable to that due to the MBE method has not been obtained. From these present situations, an MO-CVD method (Metal Organic Chemical Vapor Deposition System) that is capable of forming a large area highly crystalline thin film is attracting attention.

Minami et al. disclose, in Appl. Phys. Lett., 41 (1982) 958, the preparation of a zinc oxide material from an organometallic compound of a beta-diketone compound by use of the MO-CVD method. The disclosure thereof is confined to using the material as a transparent conductive electrode and relates to a polycrystalline zinc oxide thin film that is formed on a glass substrate and has c-axis orientation. In addition, the resistivity thereof is also insufficient. Furthermore, there is no report of applications of the fabricating method to other elements.

An example in which with the MBE method zinc oxide is applied to a transparent transistor is reported by Kawasaki et al. of Tokyo Institute of Technology in Proceedings of 2000 JSAP (the Japan Society of Applied Physics) Spring Meeting. In the report, though as the substrate a glass substrate is used, crystalline orientation is a c-axis of a wurtzite structure.

Unlike a solar battery in which conduction in a depth direction of a thin film is used, the transparent transistor, transparent conductive electrode and surface acoustic wave element make use of conduction in an in-plane direction. Nakamura et al. of Tohoku University report that when the MBE method is used, a single crystal zinc oxide thin film having a-axis orientation is suitable for the surface acoustic wave element (Jpn. J. Appl. Phys 39 (2000) L534).

A zinc oxide (ZnO) thin film formed on a polycrystalline or amorphous substrate, in almost all cases, exhibits c-axis orientation of a crystal axis. It is considered that this is due to a strong ionic bond of Zn and O. As a method of obtaining a zinc oxide thin film having a-axis orientation, the present inventors proposed a DC-bias sputtering method and reported in Proceedings of 45th Meeting of JSAP, 30aPB/II, p. 630 (March/1998). According to the method, with a substrate made of a conductive metal or an insulating substrate such as glass on a surface of which a conductive thin film such as ITO or Al is formed, a DC bias is applied on the conductive thin film, and thereby a thin film of zinc oxide is formed. According to the method, orientation control to an a-axis is made possible. However, the crystallinity is not sufficient. Furthermore, when a transparent thin film transistor is formed with the substrate of the a-axis orientation, a configuration as shown in FIG. 1 is obtained. In the transparent thin film transistor, on a zinc oxide thin film 30 having the a-axis orientation, a source electrode 42, a gate oxide film 43, a gate electrode 44 and a drain electrode 45 are formed. However, in the transparent thin film transistor, since a conductive thin film 20 for applying a DC bias is formed on the glass substrate 10, when a current is flowed between the source electrode 42 and the drain electrode 45, the current that should originally flow within the zinc oxide thin film 30 flows within the conductive thin film 20 such as ITO or Al that is very low in the resistance in comparison with zinc oxide. As a result, there occurs a structural problem that the transparent transistor does not at all work.

In the next place, as means of improving the crystallinity, the present inventors tried to epitaxially grow a polycrystalline zinc oxide thin film, with a zinc oxide thin film that is formed according to the above method and has a-axis orientation as a seed crystal, on an upper portion thereof by use of an atmospheric MO-CVD method, and obtained high crystal orientation. The above results are reported in Proceedings of Tohoku Regional Meeting of the Surface Science Society of Japan G1 P32 (November, 1998). However, it does not mean that the above structural problem caused in applying to the transparent transistor can be improved.

One of applications of the zinc oxide thin film having a-axis orientation is an electrophotography photoreceptor. The zinc oxide thin film having the a-axis orientation has a structure in which columnar crystals fall down. When a zinc oxide thin film is formed thereon by use of the MO-CVD method, larger grains grow. This allows improving photo-sensitivity of the electrophotography photoreceptor. There is a report by D. H. Zhang, D. E Brodie et al. in which they verified an improvement of the photosensitivity (Photoresponse of polycrystalline ZnO films deposited by r, f, bias sputtering; Thin Solid Films 261 (1995)334–339). The report explains that photosensitivity of a-axis orientation is remarkably higher than that of c-axis orientation. The electrophotography photoreceptor, in its sectional view, has a structure as shown in FIG. 2. As the operation mechanism thereof, firstly, a surface of a zinc oxide thin film 70 is provided with electric charges, by an electric field generated by the electric charges, light carriers that are pair-generated by an external incident light are separated in a direction vertical to a substrate 60. In FIG, 2, since positive electric charges are charged on a surface, electrons that are ones of pairs of light carriers generated by light are attracted to the surface and positive holes that are the others thereof are attracted toward the substrate. In order to generate such an electric field that is vertical to the substrate, there has to be a conductive substrate for supplying a potential to a surface of the substrate 60. So far, a drum shaped Al plate that is a conductor of low resistance is used. In place of the Al plate, ITO or Al that is a conductive thin film may be formed on an insulating substrate. From the above, it goes without saying that forming a conductive thin film on a glass substrate in order to form a zinc oxide thin film of a-axis orientation, though being a grave disadvantage in the application to the transparent transistor, is indispensable for the electrophotography photoreceptor. By summarizing examples of applications to the electrophotography photoreceptor, the present inventors applied a patent under a name of "Photoreceptor, Electrophotography Apparatus and Photoreceptor Container" in Japanese Unexamined Patent Application Publication No. 2000-137342.

An object of the present invention is to provide a polycrystalline zinc oxide semiconductor member that is high in mobility in a planar direction and has a-axis orientation of a crystal axis, and a method of fabricating the same.

Furthermore, another object of the invention is to provide a zinc oxide semiconductor member that is transparent in the visible region.

In order to accomplish the above objects, in the present invention, a polycrystalline semiconductor member formed on a substrate is characterized in that the member comprises at least zinc and oxygen as constituent elements, and a crystal orientation plane is oriented in a wurtzite structure a-axis.

DISCLOSURE OF THE INVENTION

In order to accomplish the objects, in the present invention, a method of fabricating a polycrystalline transparent semiconductor member is characterized in that the method comprises forming a conductive film on a transparent substrate; with a DC-bias applying to the formed conductive film, by use of the sputtering method, forming a polycrystalline zinc oxide thin film having a-axis orientation; and forming, by use of an MO-CVD method, a second polycrystalline zinc oxide thin film having a-axis orientation on the polycrystalline zinc oxide thin film; wherein in the MO-CVD method, hydrative zinc acetyl acetonate is used as a raw material.

When the hydrative zinc acetyl acetonate is preliminarily heated and decomposed, reactivity with an oxygen gas can be improved. Furthermore, since the zinc acetyl acetonate contains an impurity of I group or III group, an n-type or p-type semiconductor can be obtained.

The conductive film is a metal, and by forming the second polycrystalline zinc oxide thin film by means of the MO-CVD method, the conductive film of the metal can be oxidized and made higher in the transparency.

A transparent semiconductor that is formed according to the method of fabricating the polycrystalline transparent semiconductor member, provided with a transparent electrode on the second zinc oxide thin film to form an active element, and has the transmittance of 50% or more in the visible region is also included in the invention.

When a transparent substrate, a metal oxide film, a first zinc oxide thin film having a-axis orientation, and a second zinc oxide thin film having a-axis orientation are laminated, and on the second zinc oxide thin film having a-axis orientation, a transparent source electrode and drain electrode, and a transparent gate insulating film and gate electrode are formed, the element can be obtained as a transparent semiconductor element having the transmittance of 50% or more in the visible region.

When the metal oxide film is made of an oxide film of tungsten or titanium, a transparent semiconductor element that is less in the change of properties with time can be obtained.

BRIEF DESCRIPTION OF THE DRAWINGS

FIGS. 3A, 3B, 3C and 3D are diagrams showing processes of fabricating a semiconductor member made of polycrystalline zinc oxide according to the invention.

FIGS. 13A and 13B are diagrams showing measurements of photoelectron spectroscopy of a zinc oxide thin film.

BEST MODE FOR CARRYING OUT THE INVENTION

Embodiments of the present invention will be explained with reference to the drawings.

In order to prepare a ZnO thin film having a-axis orientation that is an object of the invention, it is important to form, on a crystalline substrate or an amorphous substrate, a zinc oxide thin film having wurtzite type a-axis orientation. For this, with a DC-bias applied to the substrate, a radio-frequency sputtering method is used.

As a transparent substrate 110 suitable for the formation of a transparent element, as the amorphous substrates, lead glass, PYREX™ glass, quartz glass and so on can be used. Furthermore, as polycrystalline substrate, there are ceramic substrates such as aluminum oxide, magnesium oxide and strontium titanium oxide all of which have orientation close to single crystals.

FIGS. 3A through 3D are diagrams showing an example of processes for forming a zinc oxide thin film having a-axis orientation of the invention. When the amorphous substrate is used, firstly, on the transparent substrate 110, by use of, for instance, vapor deposition, a conductive film 120 is formed (FIGS. 3A and 3B). As the conductive film 120, a material of III group that can be an n-type impurity of zinc oxide is suitable. As specific materials, metals such as Al, In, Ga and B or compounds thereof can be used. However, a conductive film may be formed with a material of I group that can be a p-type impurity.

On the conductive film 120, as shown in FIG. 3C, by use of a DC-biased radio frequency sputtering method, a first ZnO film 130 is formed. As a method of applying the DC-bias, a DC-bias is applied on a surface of the conductive film 120 deposited on the transparent substrate 110. The DC-bias can be applied with either one of a constant voltage source and a constant current source. When the DC-bias can be applied, as a sputtering power source, a frequency other than a radio frequency, for instance, a microwave can be used.

Figure 1:
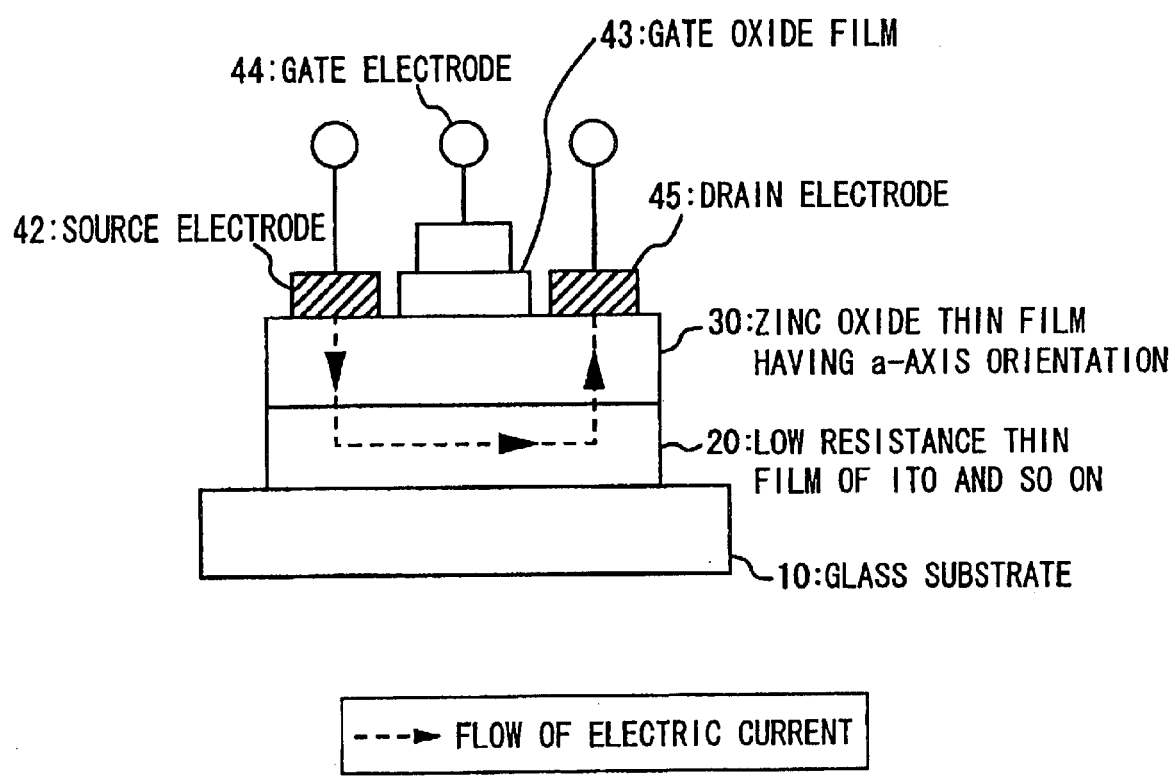
FIG. 1 is a diagram showing a transistor structure constituted of a zinc oxide thin film formed according to an existing method.
Figure 2:
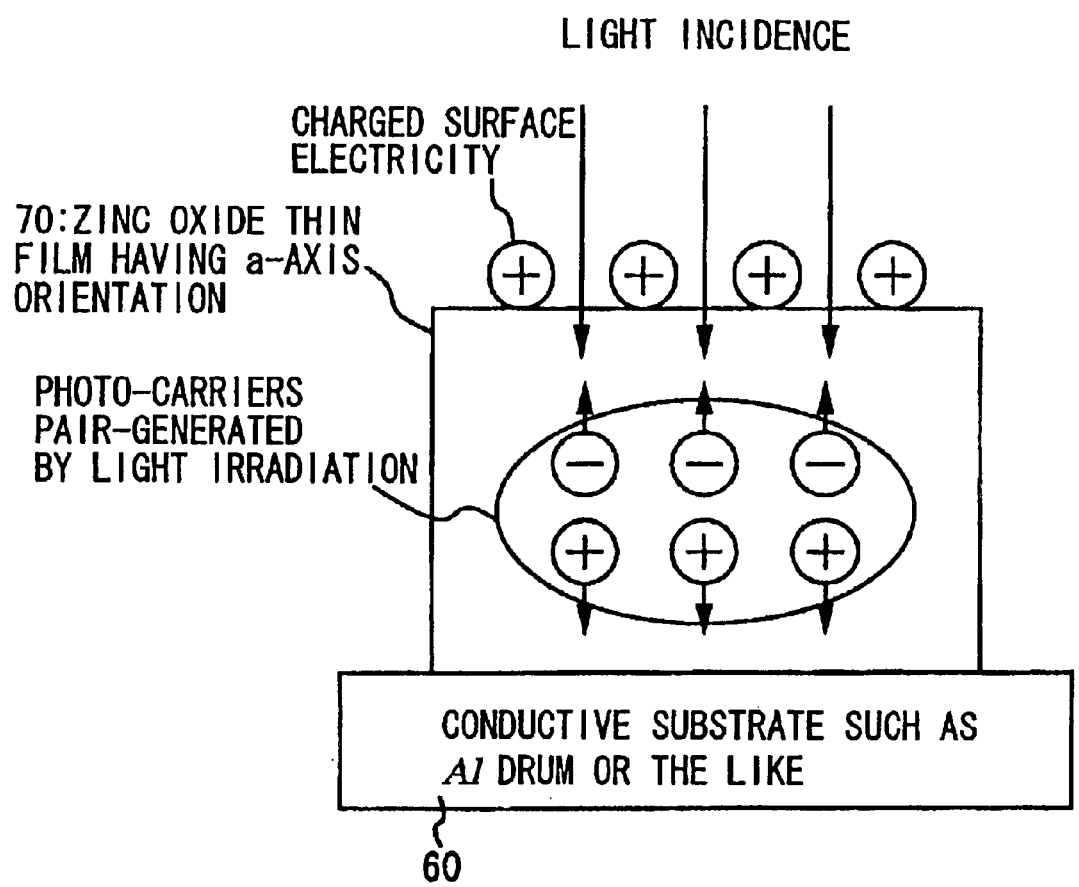
FIG. 2 is a diagram showing a sectional view of an electrophotography photoreceptor constituted according to the existing method.
Figure 4:
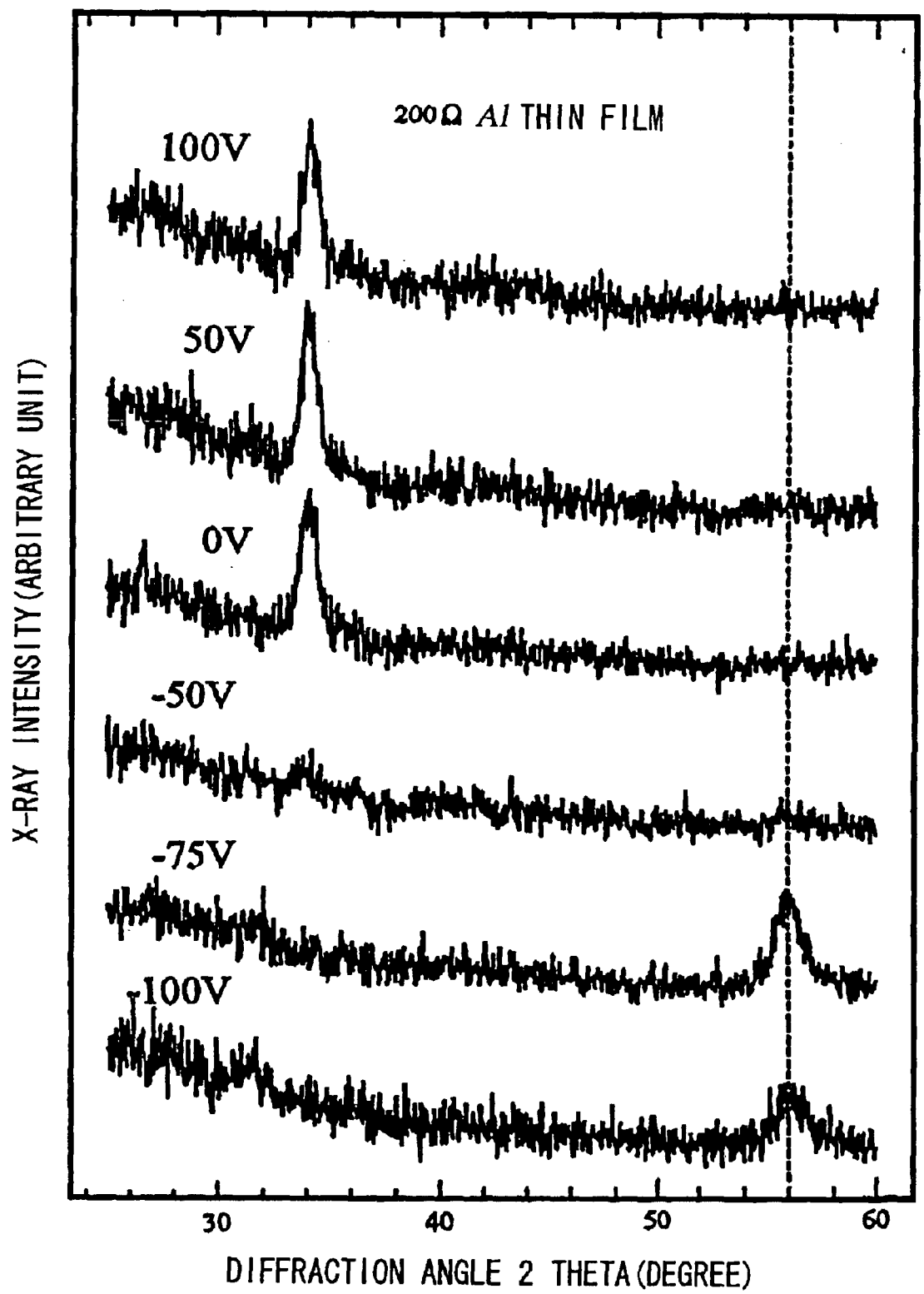
FIG. 4 is a diagram showing results of X-ray diffraction measurements of zinc oxide thin films prepared by changing an input voltage of a DC-bias.

In FIG. 4, X-ray diffraction measurements when an input DC-bias voltage applied with a constant voltage source is changed are shown. A graph shown in FIG. 4 shows results when Al is used as a conductive thin film for applying the DC-bias on a glass substrate.

As obvious from FIG. 4, when a positive bias voltage is applied, a (002) axis that is a wurtzite structure c-axis is predominant orientation, whereas when the DC-bias is set at −25V or more, a (110) axis that is a-axis orientation appears. Results shown in FIG. 4 can be obtained with excellent reproducibility. Even when the conductive thin film is replaced with ITO (an oxide of an tin indium alloy) that is an In compound, substantially same results are obtained. This is considered that owing to an input of a negative DC-bias to the substrate a positive ion gives an impact on a surface of the substrate, thereby the c-axis orientation of hexagonal structure is tilted to an a-axis orientation plane, resulting in rearrangement.

Figure 5:
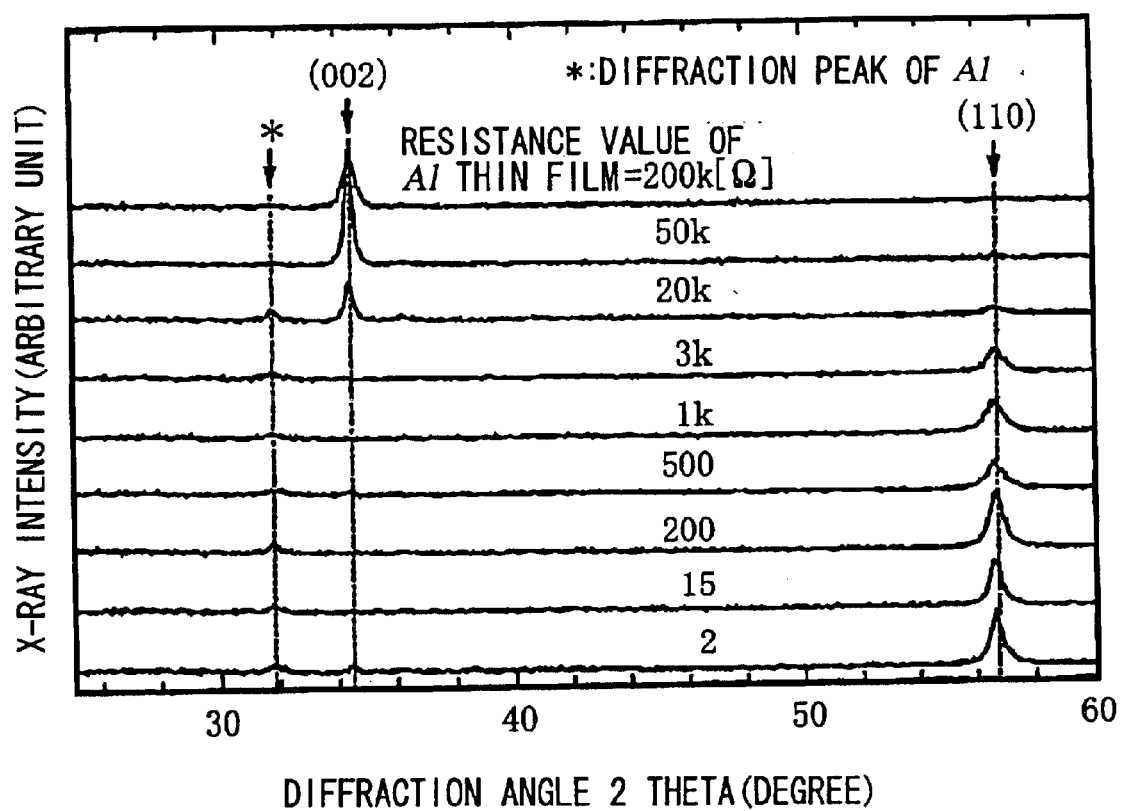
FIG. 5 is a diagram showing how to control orientation of an Al thin film according to a value of resistance.

Since an Al thin film is used in the process, it is necessary that before the final process the Al thin film is oxidized to form a transparent insulator. In addition, in order to orient zinc oxide in an a-axis with good controllability, surface resistance of the Al thin film before the oxidation is also an important factor. FIG. 5 is a diagram showing relationship between the surface resistance of Al and orientation. As obvious from the drawing, when a distance of measurement needles is set at 5 mm, with a boundary of the surface resistance of 3 k$\Omega$, the orientation largely changes. From the results, it is found that according to the DC-bias and the surface resistance of Al, the orientation can be controlled. Accordingly, a film thickness of the Al thin film has to be controlled in the range of from 100 angstrom to 800 angstrom that can give the above value of resistance.

Figure 6:
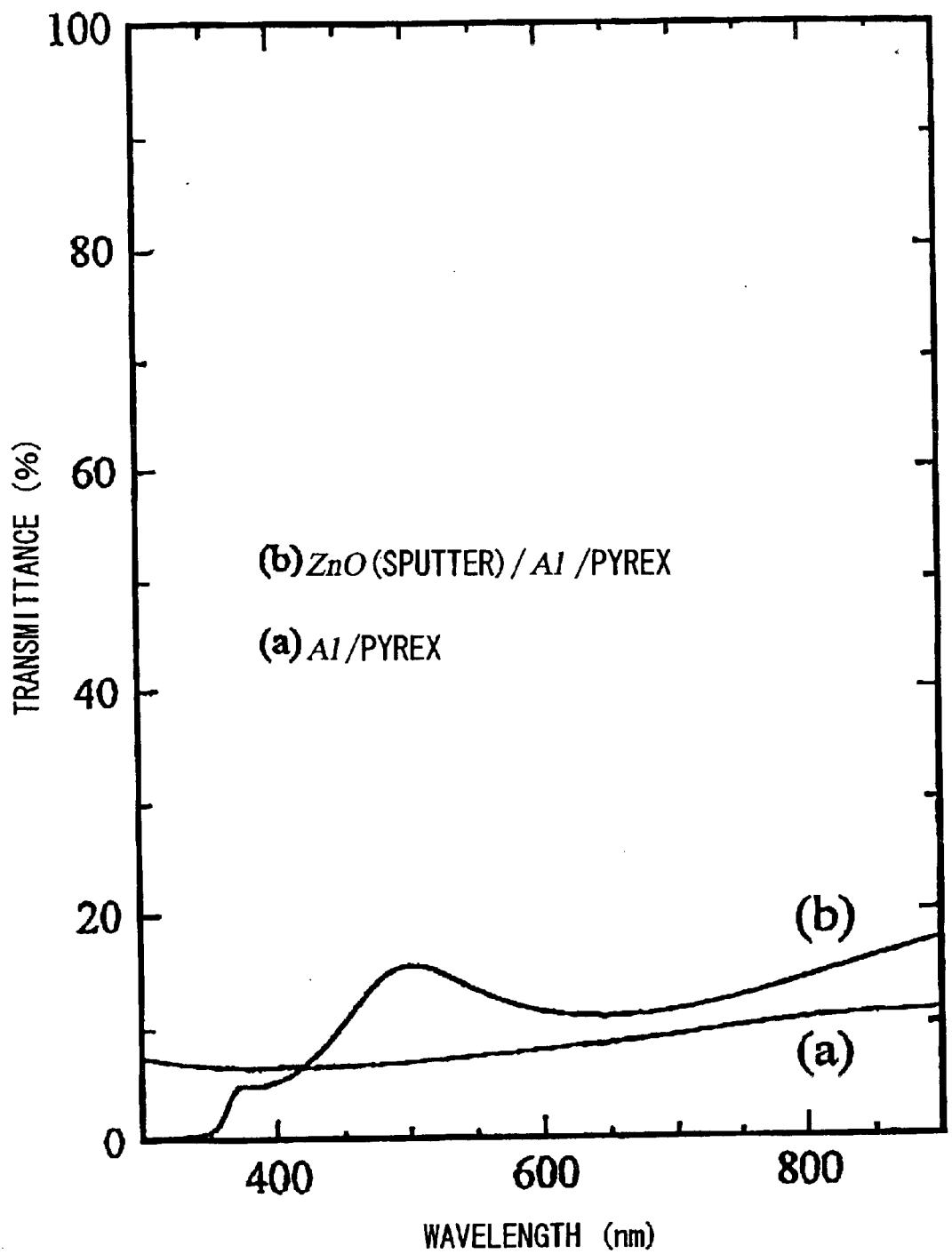
FIG. 6 is a diagram showing the transmittance when a first zinc oxide thin film is formed.

FIG. 6 is a diagram showing the transparency when an Al thin film is used. In FIG. 6, (a) shows the transparency of a sample in which an Al thin film is deposited on a PYREX™ glass substrate, and (b) shows the transparency of a sample in which a zinc oxide thin film having a-axis orientation is deposited, by use of the sputtering system, on the above Al thin film. Both samples, reflecting low transmittance of the Al thin film, show low transmittance of substantially 30% in an entire visible region. Thus, the zinc oxide thin film formed only by the sputtering, though oriented in an a-axis, is not transparent, resulting in incapability of applying in a transparent device.

Subsequently, as shown in FIG. 3D, on a surface of the above sample, a second zinc oxide thin film 140 is formed by use of an atmospheric MO-CVD method. In the atmospheric MO-CVD, metal acetyl acetonate is used as a raw material.

Figure 7:
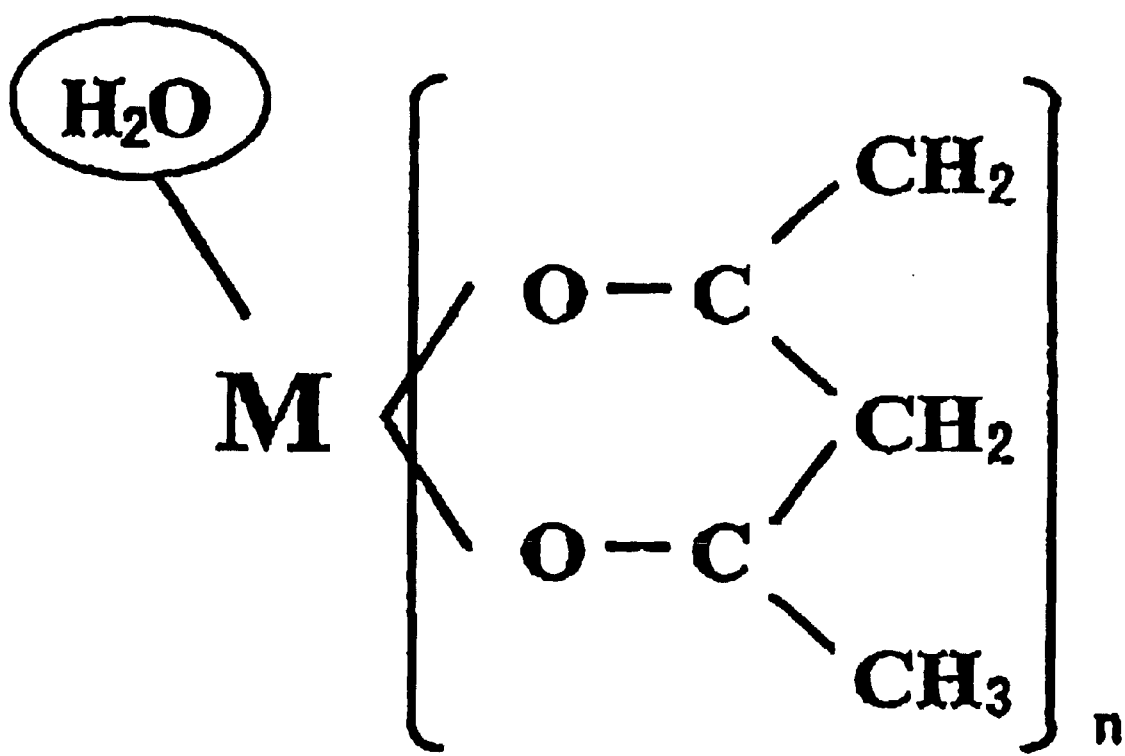
FIG. 7 is a diagram showing a molecular structural formula of metal acetyl acetonate, $M(acac)_n$ where M is a metal.). When the metal is zinc, $Zn(acac)_2$ results.

Here, the zinc acetyl acetonate used as the raw material in the atmospheric MO-CVD method will be explained. For instance, zinc acetyl acetonate ($Zn(acac)_2$) that is one of organometallic compounds of beta-diketone can be commercially obtained as a reagent, and its purity is generally in the range of from 99.8% to 99.99%. In the $Zn(acac)_2$, there are $Zn(acac)_2$ ($H_2O$) in which like a molecular structural formula shown in FIG. 7 a water molecule as a hydrate is associated with a zinc element, and anhydrous $Zn(acac)_2$. In the commercially available reagent, there is no clear description differentiating both, and hydrate and nonhydrate are mingled and sold. The Zn ($acac)_2$ ($H_2O$) is constituted of a monohydrate in which one water molecule is bonded in the process of purification, and this is the most stable hydrate.

As a raw material evaluation method of hydrate and nonhydrate, there are a differential thermal analysis (DTA) method and a thermogravimetric analysis (TG) method. The differential thermal analysis measures an endothermic reaction or an exothermic reaction when a structure of a material changes. The thermogravimetric analysis measures a weight change when the material sublimes or vaporizes. Whereas the weight change shows different values according to a heating rate, the endothermic reaction and exothermic reaction show values intrinsic to the material.

Figure 8:
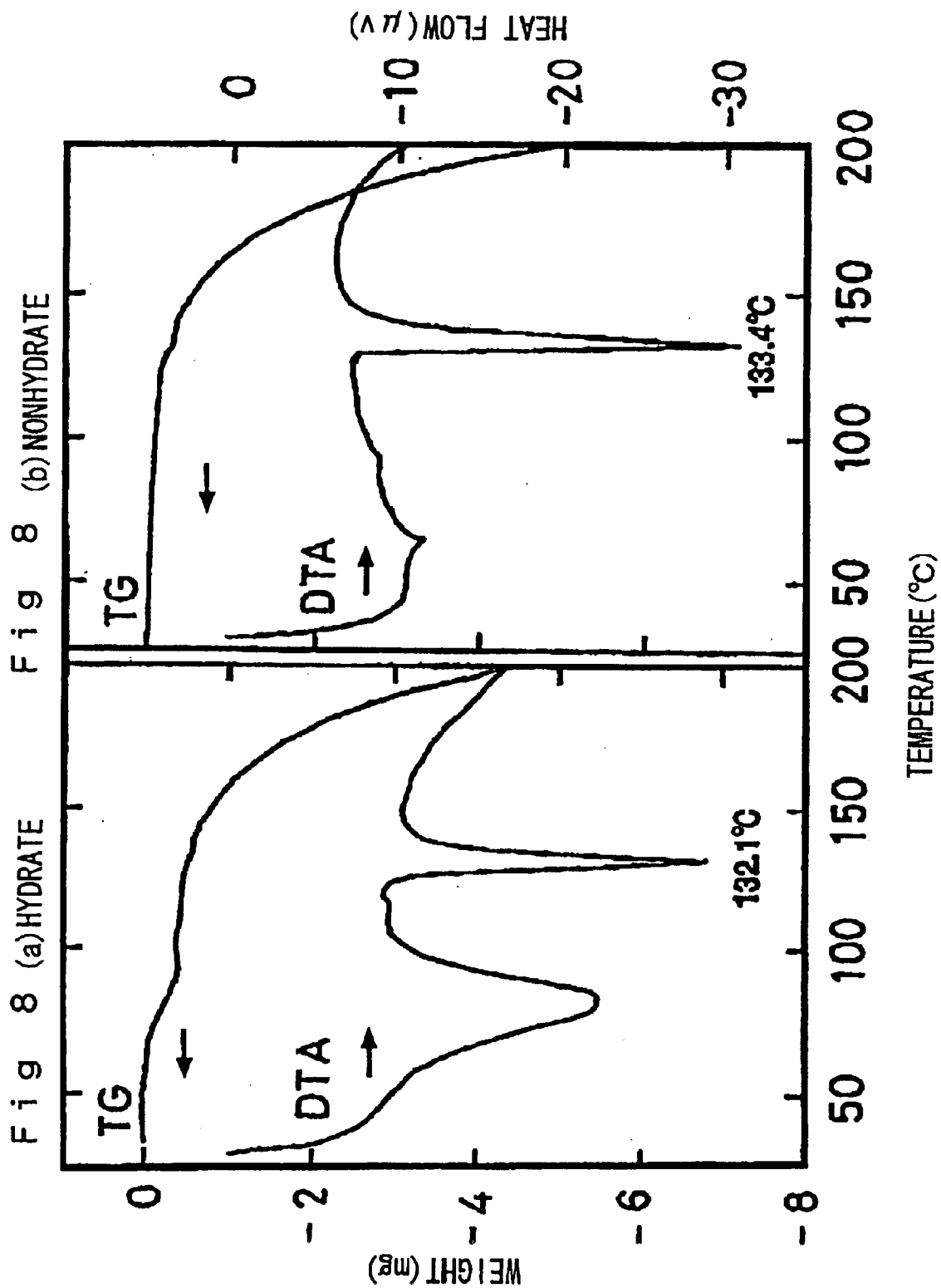
FIGS. 8A and 8B are diagrams showing TG and DTA measurements of hydrate raw material (8A) and nonhydrate raw material of $Zn(acac)_2$ (8B).

In FIGS. 8A and 8B, TG and DTA measurements of a hydrate raw material (8A) and a nonhydrate raw material (B) of $Zn(acac)_2$ are shown. The DTA and TG measurements are performed under the conditions of a temperature raise rate of 10 degree centigrade/min, a nitrogen gas flow rate of 200 cc/min and an atmospheric atmosphere. In the TG curve of a hydrate in FIG. 8A, from the neighborhood of 50 degree centigrade, weight begins to decrease little by little, and also in the DTA curve a large endothermic reaction is observed. This is considered because as a temperature is elevated, a water molecule bound to a Zn atom of $Zn(acac)_2$ as a hydrate gradually vaporizes. When the material is further heated on, a weight loss becomes rapidly larger from the neighborhood of a melting peak (132.1 degree centigrade) of the DTA curve. The TG curve of nonhydrate (FIG. 8B) starts to decrease evenly from the neighborhood of 60 degree centigrade and decreases rapidly from the neighborhood of a melting peak (133.4 degree centigrade) a little higher than that of the hydrate.

From a point of view of the crystallinity and reproducibility, in the thin film formation by means of the atmospheric MO-CVD method, it is more preferable to use the hydrate than the nonhydrate. Furthermore, in the thin film formation, the use of a mixture of the hydrate and the nonhydrate is detrimental to the formation of an excellent thin film. Still furthermore, a melting temperature is also an important factor in the formation of an excellent ZnO thin film. The melting temperature is preferable to be in the range of 132 to 135 degree centigrade.

Figure 9:
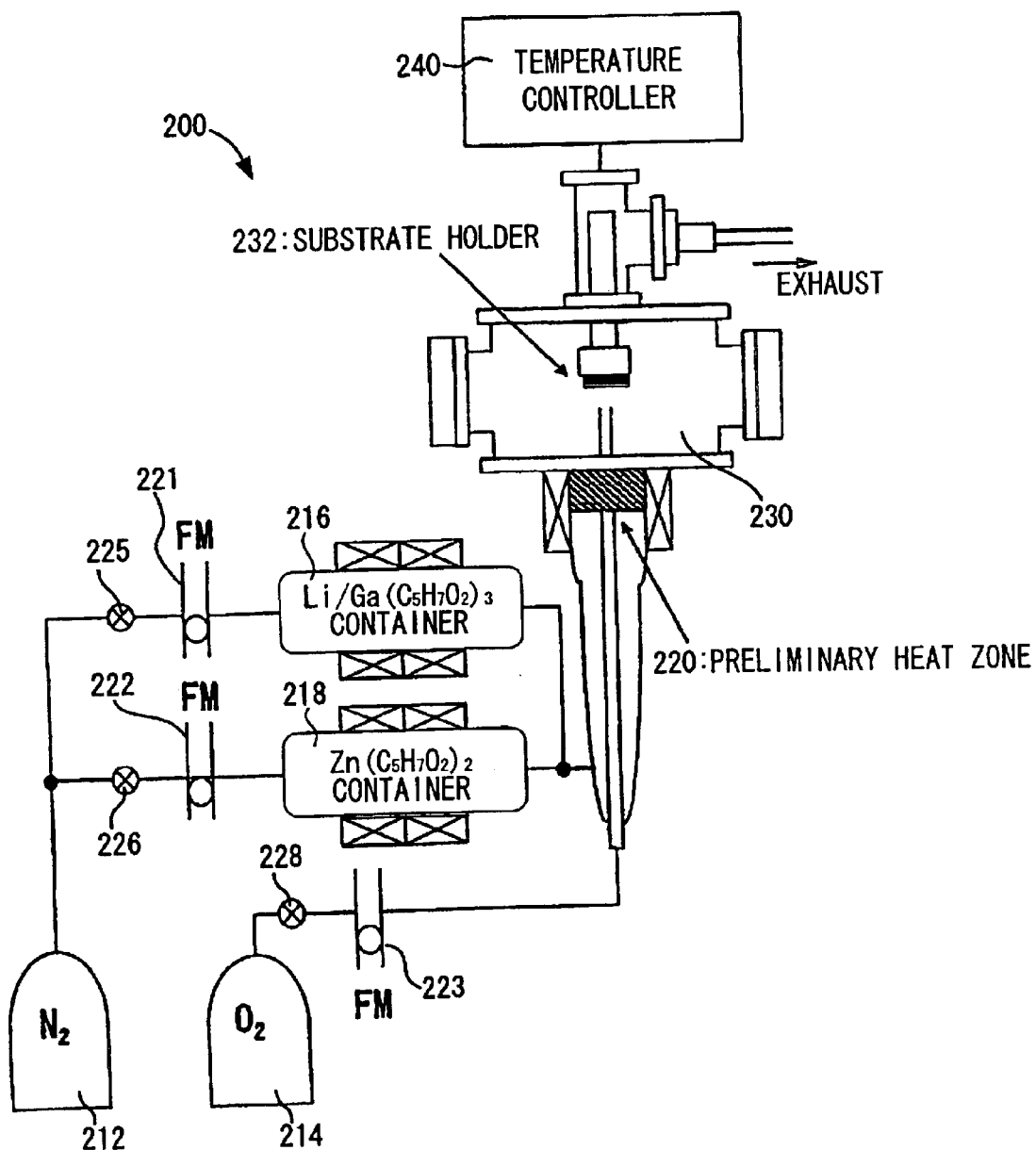
FIG. 9 is a diagram showing a configuration of a Metal Organic Chemical Vapor Deposition (MO-CVD) System.

A metal organic chemical vapor deposition (MO-CVD) system 200 used in the formation of a ZnO thin film is shown in FIG. 9. In the embodiment according to the invention, as shown in FIG. 3, in consideration of industrial mass production, a first polycrystalline zinc oxide thin film that determines crystal orientation is formed by use of the sputtering method and a second polycrystalline zinc oxide thin film is formed by use of the atmospheric MO-CVD method.

In FIG. 9, atmospheric MO-CVD raw material, $Zn(acac)_2$, is charged in a glass heating furnace (container) 218. Raw material $Zn(acac)_2$ that is confirmed to be structurally stable by means of the differential thermal analysis and has purity of 99.99% is used. The raw material sublimed in the heating furnace is carried, together with a nitrogen ($N_2$) carrier gas that is supplied from the container 212 and measured of a flow rate by a flow meter (FM) 222, to a reaction chamber 230 where a thin film is deposited. Furthermore, an oxygen gas ($O_2$) that is an oxygen raw material from a container 214, in order to avoid a gaseous phase reaction with the raw material, is separately carried in a glass tube until an immediate front of a substrate thereon a thin film is deposited.

Since $Zn(acac)_2$ is low in the reactivity with an $O_2$ gas, usually it is necessary to use pure water as a supply material of oxygen. However, it is known that when pure water is used as the raw material in an atmospheric CVD process, since moisture condensed in low temperature regions of conduits or apparatus vaporizes again as a surrounding temperature goes up, a thin film composition is difficult to reproduce. This is likely to be detrimental in an industrial fabricating process. In the system 200 used in embodiment of the invention shown in FIG. 9, in order to compensate low chemical reactivity with an $O_2$ gas, just in front of the reaction chamber 230, a preliminary heating zone 220 is disposed, and by heating, decomposition of $Zn(acac)_2$ raw material is promoted. This configuration is also one of features of embodiment of the invention.

To the second polycrystalline zinc oxide thin film, as a dopant, metal acetyl acetonate or metal dipivaloyl methanate of Li or Cu that is a I group compound, metal acetyl acetonate or metal dipivaloyl methanate of B, Ga, In, or Al that is a III group compound can be added as an impurity when a thin film is fabricated.

Figure 10:
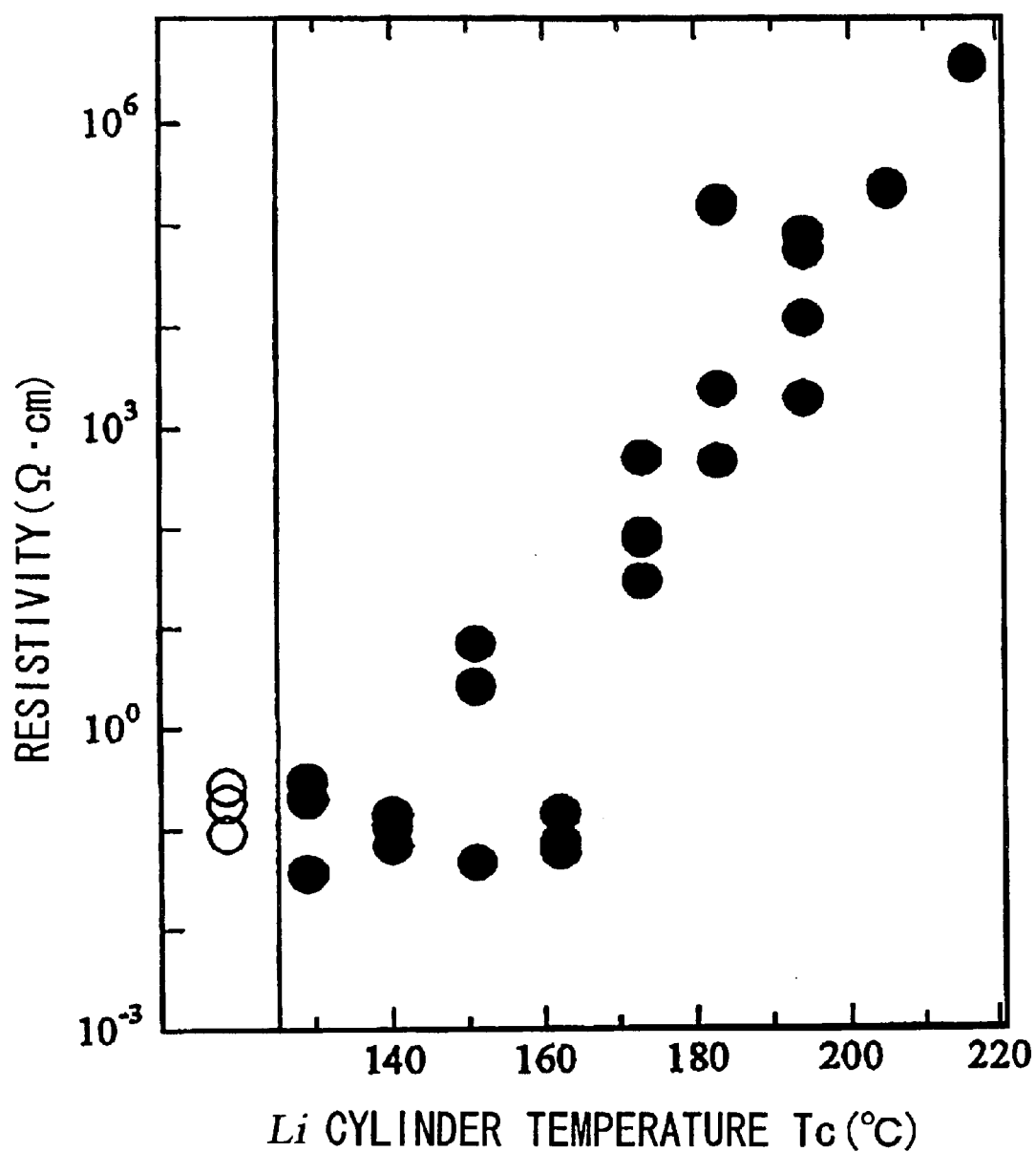
FIG. 10 is a graph showing change of resistivity of samples in which Li is added as an impurity.

FIG. 10 is a graph showing change of resistivity of samples thereto lithium (Li) is added as an impurity. An amount of addition of Li is controlled by heating a container 216 (FIG. 9) wherein Li dipivaloyl methanate (Li(DPM)) that is a raw material of Li is introduced. As shown in FIG. 10, as a temperature Tc of the container 216 is elevated, the resistivity monotonously increases.

Figure 11:
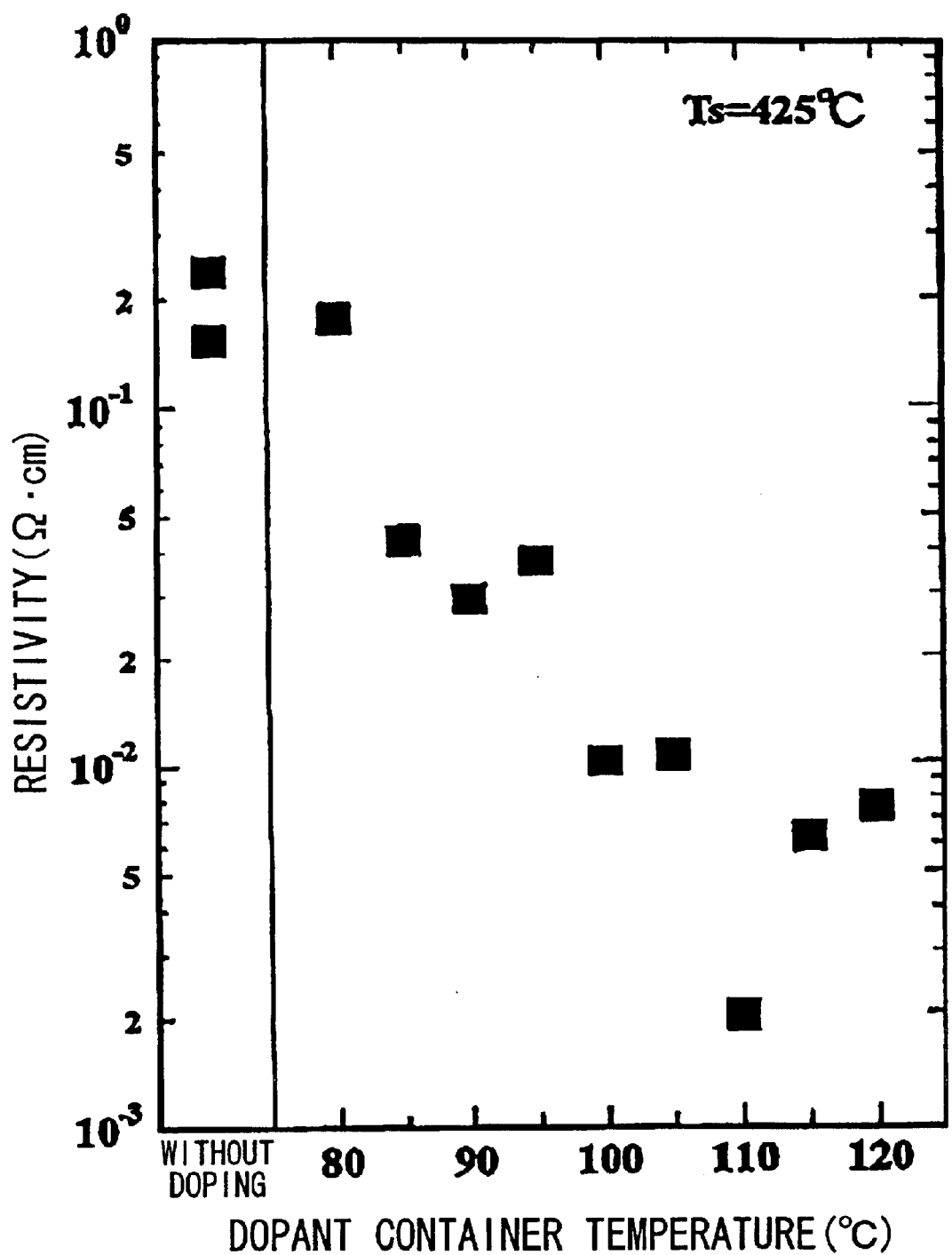
FIG. 11 is a graph showing change of resistivity of samples in which Ga is added as an impurity.

FIG. 11 is a graph showing change of resistivity of samples thereto gallium (Ga) is added as an impurity. As a raw material of Ga to be added, Ga acetyl acetonate (Ga $(acac)_3$) is used. An amount of addition of Ga is controlled by heating the container 216 wherein $Ga(acac)_3$ that is a raw material of Ga is introduced. As obvious from the drawing, as a temperature of the container 216 is elevated to increase an amount of Ga addition, the resistivity monotonously decreases and shows a minimum value at 110 degree centigrade.

As shown in FIGS. 10 and 11, while the impurity addition of Ga shows normal doping characteristics that cause a decrease of the resistivity, the addition of Li shows tendency of increasing the resistivity. This is considered that since a thin film that is not added an impurity is intrinsically an n-type, the addition of a p-type impurity generates an intrinsic semiconductor. Since a thin film that is used in a transparent element is necessary to operate at a lower current, that is, necessary to be highly resistive, the characteristics are preferable.

Figure 12:
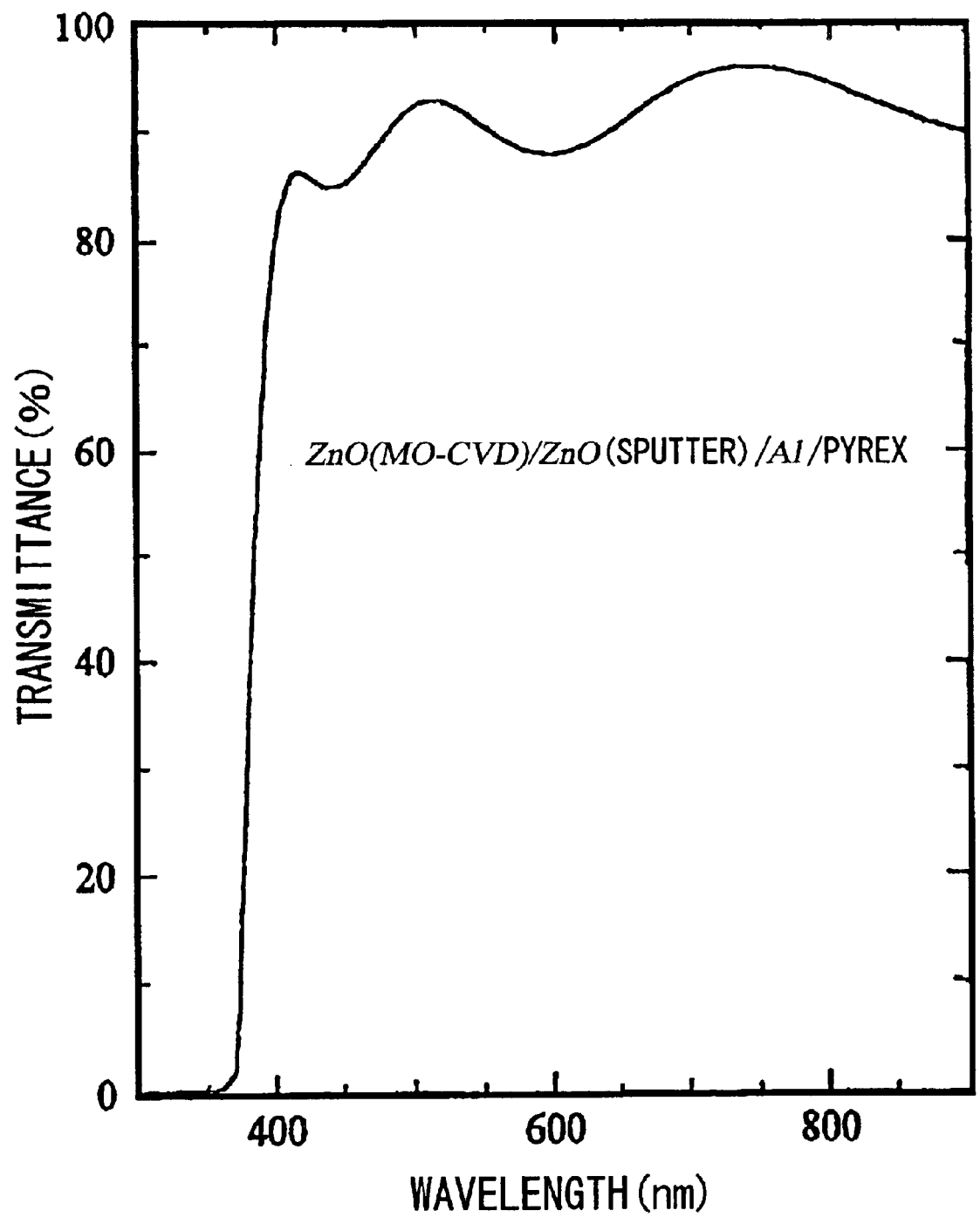
FIG. 12 is a diagram showing the transmittance of a zinc oxide thin film structure as a whole.

Total transmittance after the second polycrystalline zinc oxide thin film is formed is shown in FIG. 12. As shown in FIG. 12, after the second polycrystalline zinc oxide thin film is formed, the transmittance is largely improved. The transmittance is 80% or more in the visible region of 400 to 800 nm. However, data shown in FIG. 12 is for one that is not doped with a dopant, and when a dopant is doped, in the worst case, the transmittance decreases to substantially 60%. However, the value of the transmittance is sufficient for use in the transparent transistor. In the best thin film of which fabricating conditions are optimized, such high data as 80% is obtained, and an average value thereof is substantially 70%.

A remarkable improvement in the transmittance is due to an oxidation of an Al thin film that is formed on a glass substrate and heated when the second polycrystalline zinc oxide thin film is formed. An oxidation state of Al is measured by X-ray photoelectron spectroscopy. FIGS. 13A and 13B show results of photoelectron spectroscopy measurements. FIG. 13A shows a result after the second zinc oxide thin film is formed, and for comparison purpose, FIG. 13B shows a result after the first zinc oxide thin film is formed by means of the sputtering. The respective spectra are measurements of a surface when a zinc oxide thin film is etched from the surface thereof by use of Ar ion etching. In the spectrum after 6 min, a peak of Zn decreases largely, accordingly, it is considered that an interface of the zinc oxide thin film and the Al thin film is reached. Please pay attention to the results (drawing in the right-hand side) of Al-2s in the drawing. FIG. 13A, that is, the drawing showing a state after the formation of the second zinc oxide film, shows a mono-peaked spectrum, whereas FIG. 13B, that is, the drawing showing a state immediately after the first zinc oxide film is formed, shows a double-peaked spectrum. A peak in the neighborhood of 118 eV is due to metal Al, and that in the neighborhood of 120.5 eV is due to an oxide of Al. The zinc oxide thin film just after the sputtering has the metal Al and the oxide of Al in a mingled state, and owing to the presence of the metal Al, has lower transparency and the conductivity. However, after the second zinc oxide thin film shown in FIG. 13A is formed, the metal Al becomes a complete oxide, resulting in having both high transparency and insulation properties. In order to attain both the high transparency and insulation properties, a thickness of Al and experimental conditions have to be optimized. Furthermore, the oxide film inhibits impurities such as alkali and lead from the support substrate from diffusing into the zinc oxide thin film, and, in the case of a back gate transistor such as shown in the embodiment, partially works as a gate insulating film and improves the insulation properties.

From the above results, it is confirmed that an Al material present between a support substrate and a zinc oxide thin film attains a-axis orientation and, in the last process, is transformed into a transparent insulating thin film.

Furthermore, though Al is used in the embodiment, also when a metal of a I group or III group high in the oxidizing properties is used, the similar results can be obtained. Still furthermore, in the case of a transparent transistor being used under very severe conditions such as high temperatures or radiation irradiation, a refractory metal such as Ti, W, or Ta that can be easily oxidized can be also used. Although, in the case of the oxide of Al or the like, 80% or more of the transmittance can be obtained on average, when these refractory metals are used, the transmittance decreases to, in the worst case, 60%. Furthermore, when these refractory metals are used, rather than forming a p-n interface bonding in consideration of a leakage current, a priority should be given onto the stability at high temperatures.

(Embodiment 1)

Figure 14A:
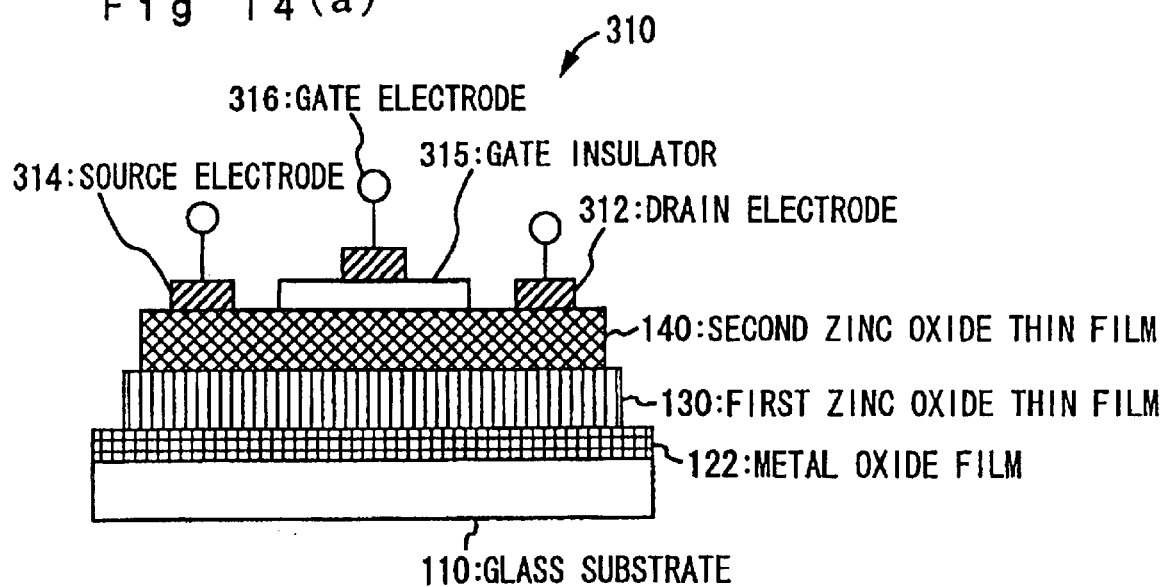
FIGS. 14A and 14B are diagrams showing an example in which a member according to the invention is applied to a transparent transistor.
Figure 14B:
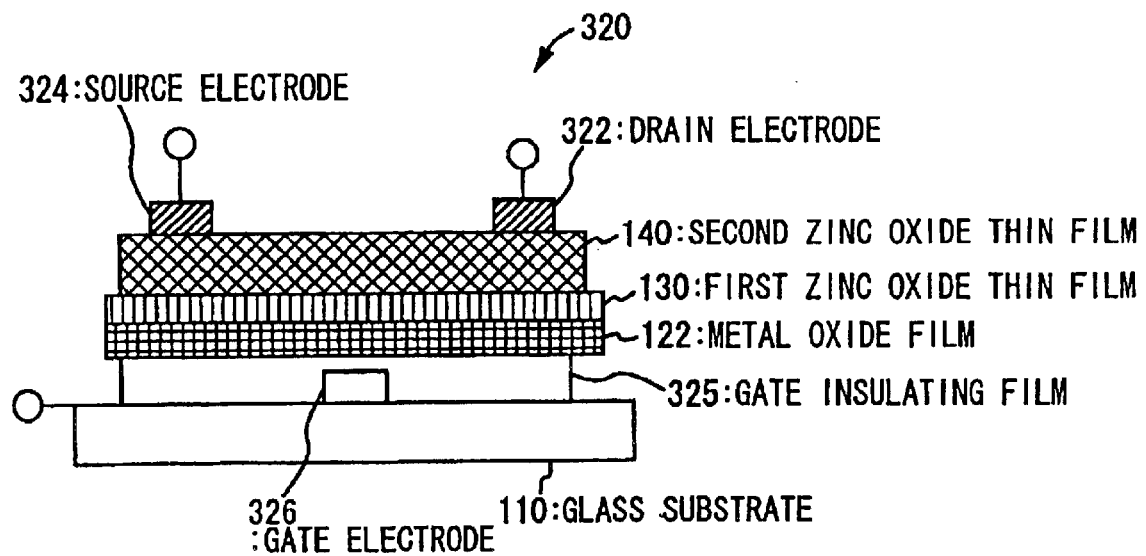

In FIGS. 14A and 14B, an example in which the member is applied to a transparent transistor is shown. FIG. 14A is a sectional view of a transistor 310. The orientation of a used zinc oxide thin film is an a-axis that is an orientation axis best fitted to a flow of a current of the transparent transistor. A thickness of a first zinc oxide thin film 130 formed on a glass substrate 110 is in the range of 500 to 1,500 angstrom, and is preferable to be 1,000 angstrom. An n conductivity type is shown by diffusion of Al atoms from an Al thin film that is deposited at an interface and used to apply a DC bias. A film thickness of an oxide of Al after the oxidation of the metal Al is in the range of 200 to 400 angstrom. A film thickness of a second zinc oxide thin film 140 is in the range of 1,000 to 2,000 angstrom, and is preferable to be 1,500 angstrom. Li is added to the second zinc oxide thin film, and thereby zinc oxide showing a value of the resistivity of 106 $\Omega\cdot$cm is deposited. A total film thickness of the transistor is substantially 2,500 angstrom.

As a gate insulating film 315, a silicon oxide film or a silicon nitride film is used. As a film thickness thereof, though depending on a gate drive voltage, one in the range of 200 to 2,000 angstrom is used. A transparent conductive film is directly deposited on the second zinc oxide thin film and used as a source electrode 314 and a drain electrode 312. As a transparent conductive film, ITO or one in which an impurity is added to the n type zinc oxide to reduce resistance is used. Furthermore, an impurity different in the conductivity type may be diffused into the second zinc oxide thin film to inhibit a leakage current from occurring due to a p-n junction. An obtained transparent transistor 310 can control a drain current according to a change of a gate voltage.

(Embodiment 2)

The transparent transistor 310 shown in Embodiment 1 has the gate electrode in an upper portion thereof, in contrast, in a transistor 320 shown in Embodiment 2 of FIG. 14B, a gate electrode 326 is formed in a lower portion. The transistor 320 has features in that the transistor is less affected by an external circumstance and, since a member of the transistor is formed after a high quality gate insulating film is formed, the transistor is less influenced by the hysteresis due to a gate voltage fluctuation. All of the features and film thicknesses of the respective thin films become the same as that of Embodiment 1. The transparent transistor of this configuration allows further reducing an off-voltage than that of Embodiment 1.

(Embodiment 3)

Embodiment 3 relates to a transparent transistor less affected by high temperatures and radiation. In a transistor made of Si or Ge, there is a problem in that, being narrow in a width of the forbidden band, owing to high temperatures or radiation, electrons in a filled band are excited to a conduction band, resulting in incapability of controlling by the gate voltage. The zinc oxide thin film has a width of the forbidden band of 3.2 eV that is twice as that of Si. Accordingly, the transistor that uses the zinc oxide thin film can be less affected by the high temperatures or radiation. However, when an oxide film of a material into which Al or Sn can easily diffuse is used, a metal component diffuses into zinc oxide, resulting in easily causing defects due to change of properties with time. Accordingly, as a structure of the transparent transistor that uses the zinc oxide thin film, though similar to that shown in FIGS. 14A and 14B, with an oxide film of tungsten (W) or titanium (Ti) as a metal oxide film, a transistor strongly resistant to the high temperatures or radiation is formed. When these oxide films are used, even under a high temperature condition of 250 degree centigrade, it is confirmed that the transistor according to the configuration can be operated without showing the change of properties with time.

What is claimed is:

1. A method of fabricating a polycrystalline transparent semiconductor member, characterized in that the method comprises:

forming a conductive film on a transparent substrate, and with a DC-bias applying to the formed conductive film, forming, according to a sputtering method, a polycrystalline zinc oxide thin film having a-axis orientation; and forming, by means of a MO-CVD method, a second polycrystalline zinc oxide thin film having a-axis orientation on the polycrystalline zinc oxide thin film;

wherein in the MO-CVD method, hydrative zinc acetyl acetonate is used as a raw material.

2. A method of fabricating a polycrystalline transparent semiconductor member as set forth in claim 1, characterized in that the hydrative zinc acetyl acetonate is preliminarily heated to decompose followed by reacting with an oxygen gas.

3. A method of fabricating a polycrystalline transparent semiconductor member as set forth in claim 1, characterized in that the zinc acetyl acetonate contains an impurity of a I group or III group.

4. A method of fabricating a polycrystalline transparent semiconductor member as set forth in claim 1, characterized in that the conductive film is a metal, and by forming the second polycrystalline zinc oxide thin film by means of the MO-CVD method, a conductive film of the metal is oxidized to improve transparency.

5. A transparent semiconductor, characterized in that the transistor is fabricated according to the method of fabricating a polycrystalline transparent semiconductor member set forth in claim 1, provided with a transparent electrode disposed on the second zinc oxide thin film to form an active element, and has transmittance of 50% or more in the visible region.

6. A transparent semiconductor element, characterized in that the semiconductor element is fabricated by laminating a transparent substrate, a metal oxide film, a first zinc oxide thin film having a-axis orientation, and a second zinc oxide thin film having a-axis orientation, and by disposing, on the second zinc oxide thin film having a-axis orientation, a transparent source electrode and drain electrode, and a transparent gate insulating film and gate electrode, and has transmittance of 50% or more in the visible region.

7. A transparent semiconductor element as set forth in claim 6, characterized in that the metal oxide film is a film of oxide of tungsten or titanium.

8. A transparent semiconductor, characterized in that the transistor is fabricated according to the method of fabricating a polycrystalline transparent semiconductor member set forth in claim 2, provided with a transparent electrode disposed on the second zinc oxide thin film to form an active element, and has transmittance of 50% or more in the visible region.

9. A transparent semiconductor, characterized in that the transistor is fabricated according to the method of fabricating a polycrystalline transparent semiconductor member set forth in claim 3, provided with a transparent electrode disposed on the second zinc oxide thin film to form an active element, and has transmittance of 50% or more in the visible region.

10. A transparent semiconductor, characterized in that the transistor is fabricated according to the method of fabricating a polycrystalline transparent semiconductor member set forth in claim 4, provided with a transparent electrode disposed on the second zinc oxide thin film to form an active element, and has transmittance of 50% or more in the visible region.

* * * * *